United States Patent
Luo et al.

(10) Patent No.: US 10,931,307 B2
(45) Date of Patent: Feb. 23, 2021

(54) VARIABLE READ ERROR CODE CORRECTION

(71) Applicant: Micron Technology, Inc., Boise, ID (US)

(72) Inventors: Xiangang Luo, Fremont, CA (US); Ting Luo, Santa Clara, CA (US)

(73) Assignee: Micron Technology, Inc., Boise, ID (US)

(*) Notice: Subject to any disclaimer, the term of this patent is extended or adjusted under 35 U.S.C. 154(b) by 49 days.

(21) Appl. No.: 16/235,171

(22) Filed: Dec. 28, 2018

(65) Prior Publication Data

US 2020/0212935 A1  Jul. 2, 2020

(51) Int. Cl.
*H03M 13/11* (2006.01)
*G06F 11/10* (2006.01)

(52) U.S. Cl.
CPC ..... *H03M 13/1128* (2013.01); *G06F 11/1076* (2013.01)

(58) Field of Classification Search
CPC .............. H03M 13/1128; G06F 11/1076
See application file for complete search history.

(56) References Cited

U.S. PATENT DOCUMENTS

| 7,827,461 B1 * | 11/2010 | Low | H03M 13/6591 |
| | | | 714/752 |
| 8,984,376 B1 * | 3/2015 | Norrie | H03M 13/1142 |
| | | | 714/772 |
| 2013/0132791 A1 * | 5/2013 | Alrod | G06F 11/10 |
| | | | 714/752 |
| 2017/0097868 A1 * | 4/2017 | Kim | G11C 7/00 |
| 2018/0137003 A1 * | 5/2018 | Pignatelli | G06F 11/1012 |

* cited by examiner

*Primary Examiner* — Guy J Lamarre
(74) *Attorney, Agent, or Firm* — Schwegman Lundberg & Woessner, P.A.

(57) ABSTRACT

Devices and techniques for variable read throughput control in a storage device are described herein. Bits from can be received for a read that is one of several types assigned to reads. A low-density parity-check (LDPC) iteration maximum can be set based on the type. LDPC iterations can be performed up to the LDPC iteration maximum and a read failure signaled in response to the LDPC iterations reaching the LDPC iteration maximum.

24 Claims, 6 Drawing Sheets

VARIABLE READ ERROR CODE CORRECTION

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), or magnetoresistive random-access memory (MRAM), among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) can extend adjacent a string of storage cells to form a channel for the storages cells of the string. In the example of a vertical string, the polysilicon structure can be in the form of a vertically extending pillar. In some examples the string can be "folded," and thus arranged relative to a U-shaped pillar. In other examples, multiple vertical structures can be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs can include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

Figure 1:
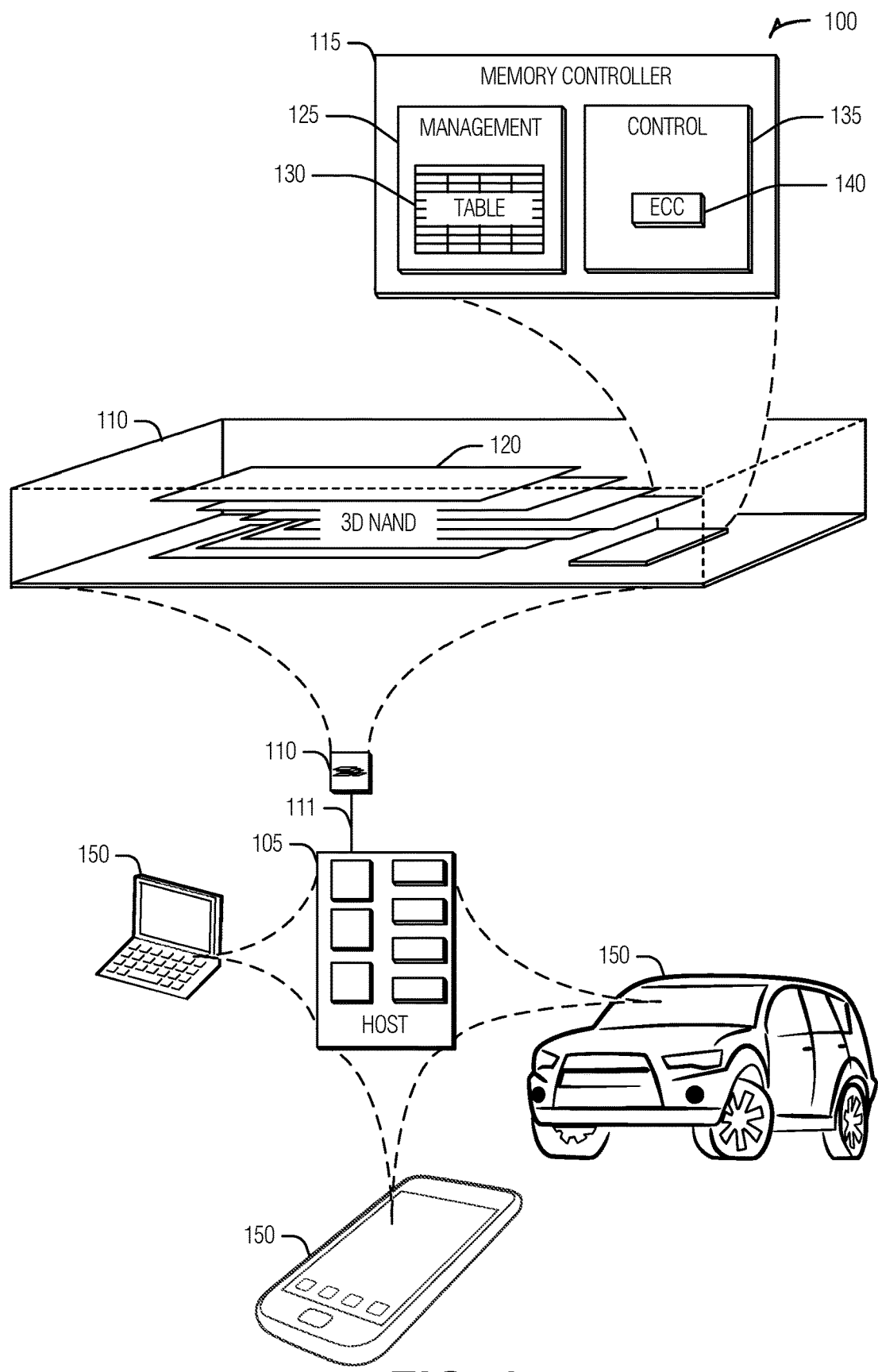
FIG. 1 illustrates an example of an environment including a memory device.

It is possible for the cells or other underlying storage devices of the memory system to produce an incorrect bit when read. For example, if a '1' where stored, a '0' can be read when the charge trapped in an SLC is not properly maintained by damage to the SLC, or other such events. Traditionally, these "bit flips" (e.g., inadvertent corruption of the data) are detected, and possibly corrected, via an error correction code (ECC) technique. ECC techniques involve storage of additional bits (e.g., parity) of written data. When the data is read, the additional bits are used to determine whether there is an error in the read data.

There are several different ECC techniques, including the low-density parity-check (LDPC) technique. LDPC is popular in many applications because they can provide performance that is near the limit of computational efficiency. Although the details of LDPC are beyond the scope of this document, LDPC essentially involves constructing a relationship between bits of data being encoded called a sparse parity-check matrix that is then used to construct LDPC codes (e.g., parity codes). These are then stored. Upon a read, each parity check is generally treated as an independent single parity check (SPC) code, decoded using a soft-in-soft-out technique. Here, a soft decision is made for at each parity check and then cross-checked with other SPC codes. The SPC code is then decoded again using soft updates from the cross-checking. This results in an iterative process that tends to complete when a valid code-word is achieved or decoding is exhausted (e.g., there are no other SPCs). Generally, when decoding is exhausted, a read error is indicated and possibly other error correction techniques—such as additional read trials of the underlying hardware—employed. Thus, in an example, if an ECC component (e.g., engine) cannot decode a first read (e.g., first read trial), then more read trials can be issued until the data is decoded successfully or an error is returned if all read trials have been attempted without success.

A performance problem for the LDPC ECC technique described above occurs when error rates rise. Specifically, when error rates are high—such as greater than forty errors per one thousand bits—read throughput precipitously drops. For example, if the memory device had an 800 megabyte per second (MBs) throughput with fewer than forty errors per one thousand bits, the read throughput can drop to less than twenty MBs when the bit error rate is sixty or more per one thousand bits. When bit-error-rate to throughput is plotted, it becomes evident that the additional cycles have diminishing returns with respect to error recovery with some significant percentage (e.g., ten percent) requiring some other form of error correction, if error correction is even possible.

To address the issues above, a variable iteration LDPC technique can be used to control how fast the LDPC technique will fail on bad data. A maximum number of iterations is defined based on a type of read. For example, if read throughput is important for an application (e.g., not many errors are expected or errors can be dealt with later), then a performance type of read can be executed with a lower maximum number of iterations than other types of reads. If, however, speed is less important than data accuracy, a standard read type can be performed with a corresponding higher maximum number of iterations than the performance type of read. If the maximum is reached, then the LDPC check failed. Thus, by using a performance read (e.g., lower maximum number of LDPC iterations), then the read will fail more quickly when bad data is encountered. This can reduce latencies to perform other error correction options, or to simply regard the data as lost. Additional details and examples are provided below.

FIG. 1 illustrates an example of an environment 100 including a host device 105 and a memory device 110 configured to communicate over a communication interface. The host device 105 or the memory device 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105. In these examples, the memory device 110 communicates with host device 105 components via an interlink 111, such as a bus. Thus, as described herein, a host, or host device 105 operation is distinct from those of the memory device 110, even when the memory device 110 is integrated into the host device 105.

One or more communication interfaces (e.g., the interlink 111) can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMCT™ interface, or one or more other connectors or interfaces. The host device 105 can include a host system, an electronic device, a processor, a memory card reader, or one or more other electronic devices external to the memory device 110. In some examples, the host 105 can be a machine having some portion, or all, of the components discussed in reference to the machine 600 of FIG. 6.

The memory controller 115 can receive instructions from the host 105, and can communicate with the memory array 120, such as to transfer data to (e.g., write or erase) or from (e.g., read) one or more of the memory cells, planes, sub-blocks, blocks, or pages of the memory array 120. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. Although the memory controller 115 is here illustrated as part of the memory device 110 package, other configurations can be employed, such as the memory controller 115 being a component of the host 105 (e.g., as a discrete package on a system-on-a-chip of the host 105 that is separate from the memory service 110), or even implemented via a central processing unit (CPU) of the host 105.

The memory manager 125 can include, among other things, circuitry or firmware, such as several components or integrated circuits associated with various memory management functions. For purposes of the present description example memory operation and management functions will be described in the context of NAND memory. Persons skilled in the art will recognize that other forms of non-volatile memory can have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things. In an example, the management tables 103 can include translation tables or a logical-to-physical (L2P) mapping.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data based on the ECC data maintained by the array controller 135. This enables the memory controller 115 to maintain integrity of the data transferred between the host 105 and the memory device 110 or maintain integrity of stored data. Part of this integrity maintenance can include removing (e.g., retiring) failing memory resources (e.g., memory cells, memory arrays, pages, blocks, etc.) to prevent future errors. RAIN is another technique that can be employed by the memory device 110 to maintain data integrity. The array controller 135 can be arranged to implement RAIN parity data generation and storage in the array 120. The memory controller 115 can be involved in using the parity data to reconstruct damaged data.

A typical ECC technique involves the iterative LDPC technique. As noted above, the greater the number of iterations, the more robust (e.g., reliable) the LDPC output. However, this can incur a performance penalty by, for example, performing many LDPC iterations that ultimately will not decode the data. Thus, to address this issue, a variable LDCP iterative process is implemented by the memory device 110. The following examples describe configuration of the ECC component 140, however, these hardware configurations can be implemented in the array controller 135, the memory manager 125, or the memory controller 115, depending on hardware design decisions.

The ECC component 140 is configured to receive bits from a read (e.g., a first read trial, or the first read of the data). Here, the read has a corresponding type that is one of several types that can be assigned to reads. The read types can be set by the host 105, for example, via a read interface flag (e.g., signal, indication, etc.)—such as a register or bits in the read command—or via convention. For example, if the type is a is a performance type (e.g., lowest LDPC iteration maximum), it can be the read type for a first read trial of the data. Thus, in this example, the performance type of read is an unflagged read. However, in an example, if the read is a second read trial—such as can occur when the first read trial failed—then convention can set the read type as a read-error type, which would again be unflagged.

The ECC component 140 is configured to set an LDPC iteration maximum based on the type of read and then to perform the LDPC iterations up to the LDCP iteration maximum. The LDPC iteration maximum operates to end the LDPC check when the number of iterations reaches the maximum even if further decode opportunities exist. Thus, when the LDPC iteration maximum is set below the total number of possible decodes, it causes the LDPC check to fail earlier than in traditional LDPC operation. Thus, the ECC component 140 is configured to return an error if the number of iterations meet or exceed the LDPC iteration maximum. In an example, when a read failure is signaled in response to the LDPC iterations reaching an LDPC iteration maximum, the ECC component 140, the memory controller 115, or other circuitry, provokes (e.g., initiates) a read trial operation to recover the data. As noted above, the read trial operation (e.g., a second or third read trial) can change the read type for a subsequent read of the same bits.

If the ECC component 140 finds the code words prior to reaching the LDPC iteration maximum, the ECC component 140 is configured to return (e.g., indicate) success much as it would if it found these code words before exhausting all decode possibilities. Thus, in an example, the LDPC iteration maximum implements a performance change in read throughput. In an example, the performance change occurs at between thirty-five error bits per one thousand bits and forty-five error bits per one thousand bits inclusive.

As noted above, the LDPC iteration maximum is set based on the type of read. The type of read is one of several that the ECC component 140 is configured to recognize. In an example, the types of read are ordered. The ordering can be based on the performance level sought. In an example, the LDPC iteration maximum of between two types of read is a multiple based on the ordering. Thus, for example, if the read type is "standard," the corresponding LDPC iteration maximum is an integer multiple of the LDPC iteration maximum that corresponds to a read type of "performance;" a read type ordered higher than "standard." In an example, the multiple is two or three times that of a read type of an immediately preceding higher order in the several read types. In an example, the lowest ordered read type, such as a "read error type," has an LDPC iteration maximum that meets or exceeds the total possible decodes in the LDPC technique. Thus, the LDPC iteration maximum, in this example, causes the ECC component 140 to perform the LDPC check in the traditional manner.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

Figure 2:
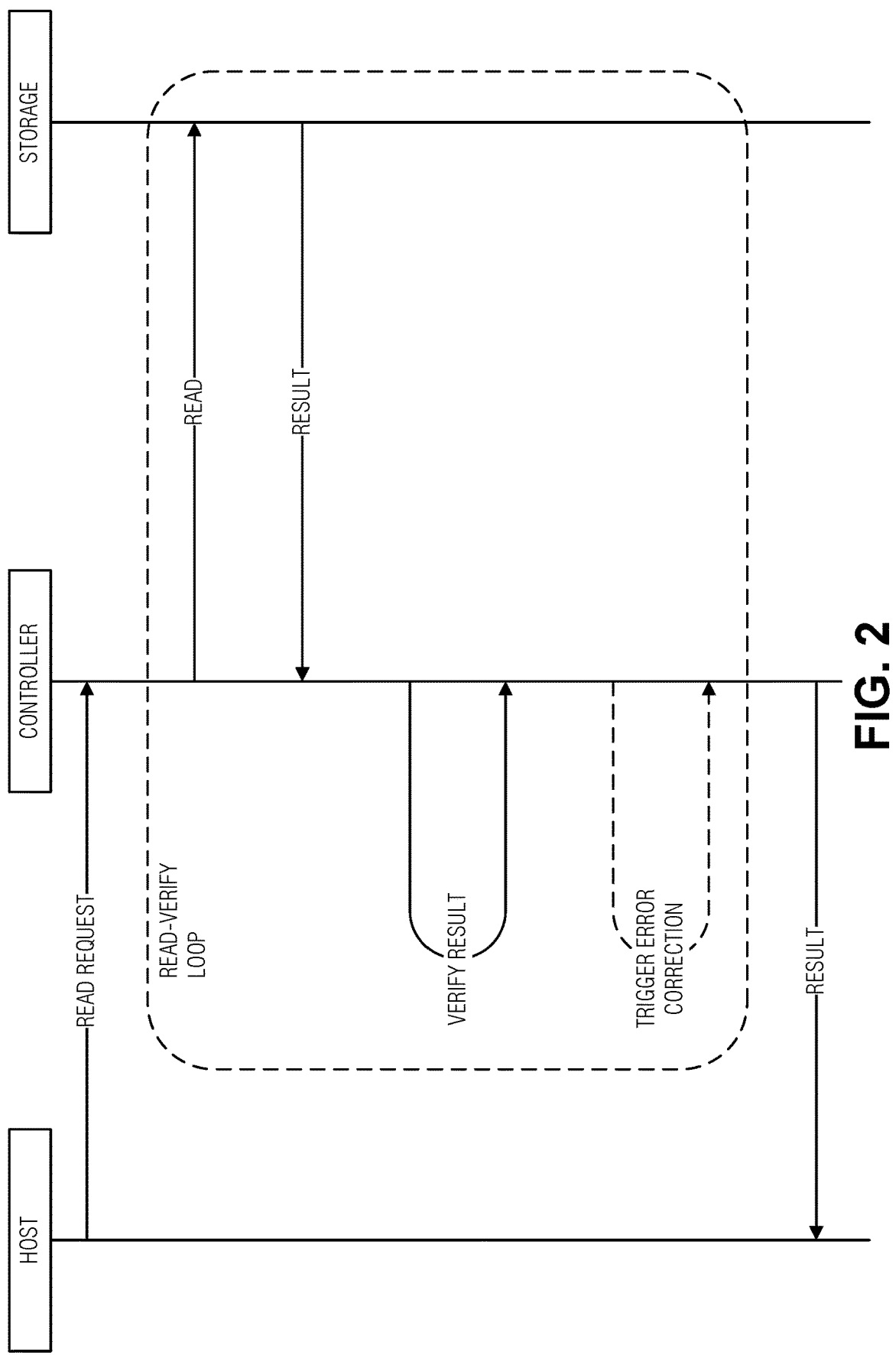
FIG. 2 illustrates an example of a message flow in a system using error code correction (ECC) on a read.

FIG. 2 illustrates an example of a message flow in a system using ECC on a read. The illustration is at a relatively high level with the component separation being between the host, the controller, and the underlying storage. The controller here is similar to the memory controller or array controller described above. The storage here provides the cells (e.g., NAND MLC) to actually hold any data.

The host initiates a read request to retrieve data. The data was previously stored in the storage with ECC. In an example, the read request includes a flag to indicate what sort of read it is (e.g., a read type). In an example, the flag is one bit. Enabling the host to define the type of read request gives greater control to the host in determining read throughput using the variable ECC iteration technique. This is often useful because it is the host that has some context as to the type or importance of the data being read.

In an example, the read request does not indicate what type of read it is. In this example, the type of read is defined by convention in the controller. This technique can be useful when an interface to the controller of the storage does not permit the explicit signaling of read types. In an example, the inference occurs when a flag to indicate the read type is not set in the read request even when the interface or protocol defines such a flag.

After the read request is received at the controller, the controller enters into a read-verify loop. First, the data is read from the storage and the result returned to the controller. The controller then verifies the result using an ECC technique, such as an LDPC check. The controller latency in completing the verification is dependent on the error rate of the result as well as either the maximum iterations defined by the read type or the total possible decodes. Thus, to ensure that the result verification has a short delay in processing the read request, a lower maximum iterations will exit this operation sooner with a failure if the result is corrupt.

In a failure condition of the verification operation, the controller can engage in several different operations. For example, the controller can trigger error correction itself. The error correction can include performing additional read trial and result verification cycles. In these cycles, in an example, each subsequent read can progress through the available read types to increase the maximum iterations. This will increase the time spent the result verification operation but can possibly correct error in the result. In an example, the controller can simply provide an error indication to the host. The host can then operate to correct the error (e.g., perform error correction), initiate a new read request for the same data with different parameters (e.g., a different read type), or other operations or do nothing at all.

Once the read-verify loop is complete, the results—such as they are—are returned to the host. Thus, the result can include an error condition if the data could not be correct, or the result can be the data without error. In any case, the setting of the maximum iterations (e.g., via the read request or by convention) enables control on the duration of the read-verify loop, which directly impacts read latency and thus read throughput.

Figure 3:
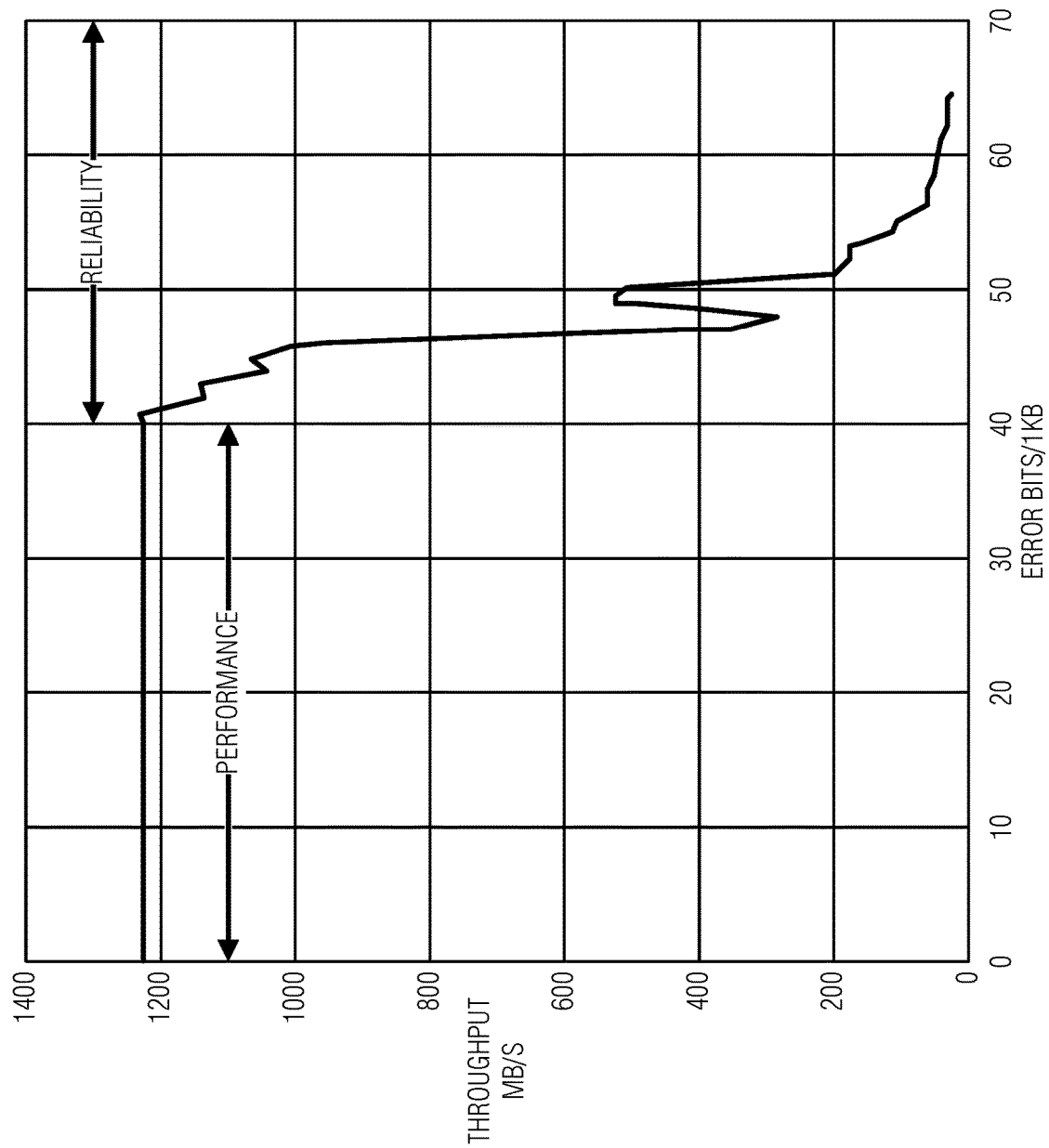
FIG. 3 illustrates an example of a plot comparing ECC throughput to error recovery.

FIG. 3 illustrates an example of a plot comparing ECC throughput to error recovery. The plot is a demonstration of experimental results indicating that LDPC checks have a non-linear impact on read throughput based on the error rate. As illustrated, the x-axis represents the number of bit errors for each one kilobyte (KB) in a read, and the y-axis represents the throughput in MBs per second. The plot has an inflection point at about forty errors per KB in which read throughput drops precipitously. The error rate prior to (e.g., to the left of) this inflection point can be considered a performance zone, while the area after the inflection point is a reliability zone. A given device can be measured with a similar technique to discover these two zones. The maximum iterations for the ECC calculation can then be set such that, in a performance read request, the ECC operation will fail if valid codes are not found before entering the reliability zone, reducing latency in completion of the read operation.

Figure 4:
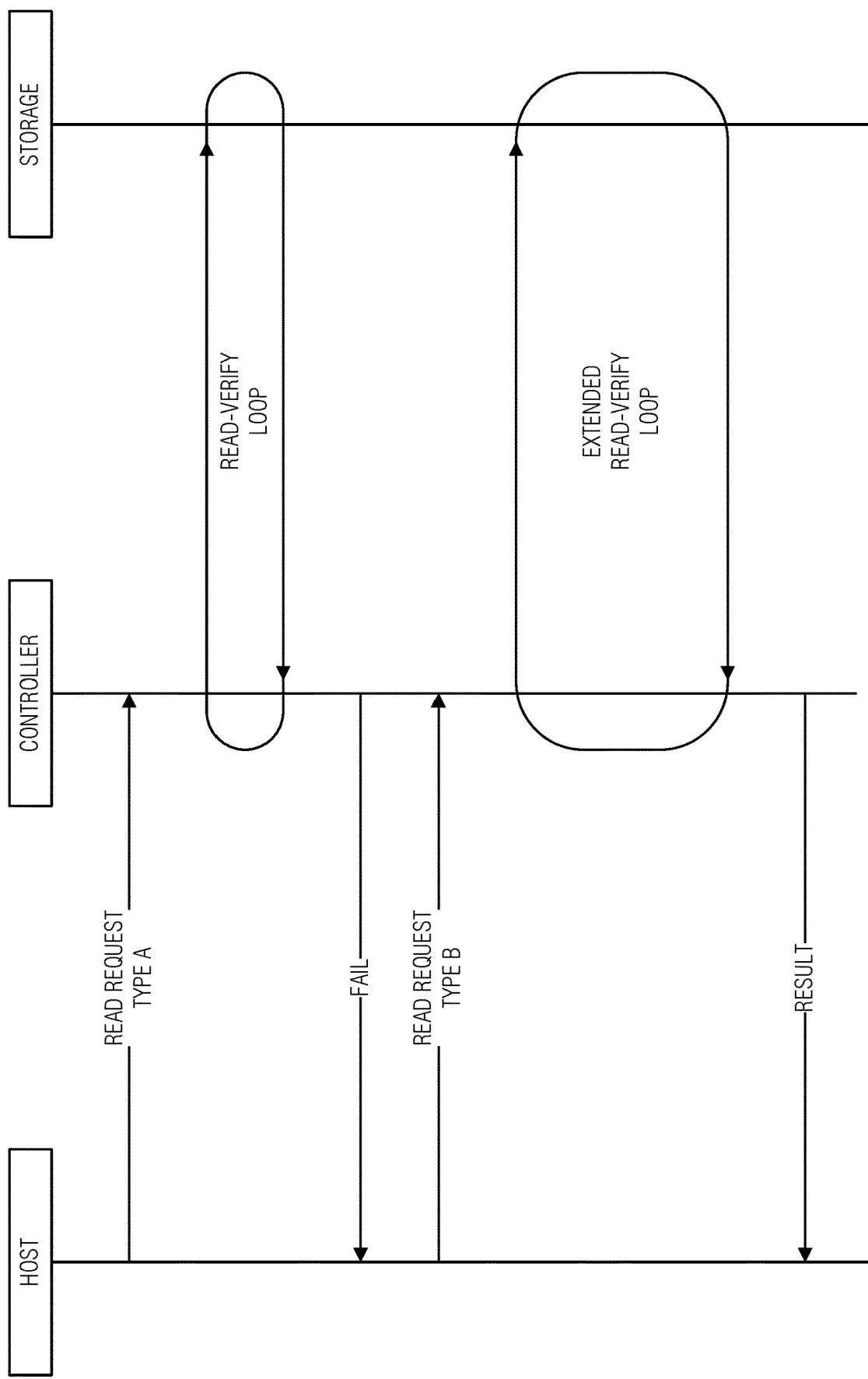
FIG. 4 illustrates an example of a message flow in a system using variable ECC on a read.

FIG. 4 illustrates an example of a message flow in a system using variable ECC on a read. Like FIG. 2 described above, the illustration is at a relatively high level with the component separation being between the host, the controller, and the underlying storage. The controller here is similar to the memory controller or array controller described above. The storage here provides the cells (e.g., NAND MLC) to actually hold any data.

The host initiates a read request of a specific type to retrieve data. As in FIG. 2, after the read request is received at the controller, the controller enters into a read-verify loop that is constrained by the type of read request. As illustrated, the read-verify loop does not succeed in returning valid data, and so the controller signals this failure to the host. The host then initiates a second read request of a different type than the first (e.g., a read error request) to the controller. This second request causes the controller to change the bounds of the ECC operation to create an extended read-verify loop to correct the error. When successful, the controller returns the result to the host.

The example illustrated in FIG. 4 is alluded to in the discussion regarding FIG. 2. Here, the illustration clearly shows the increased host control of the read latency when errors appear. As noted above, because the host is better able to determine the importance of data integrity or read performance, this variable ECC technique can provide performance benefits to the host device.

Figure 5:
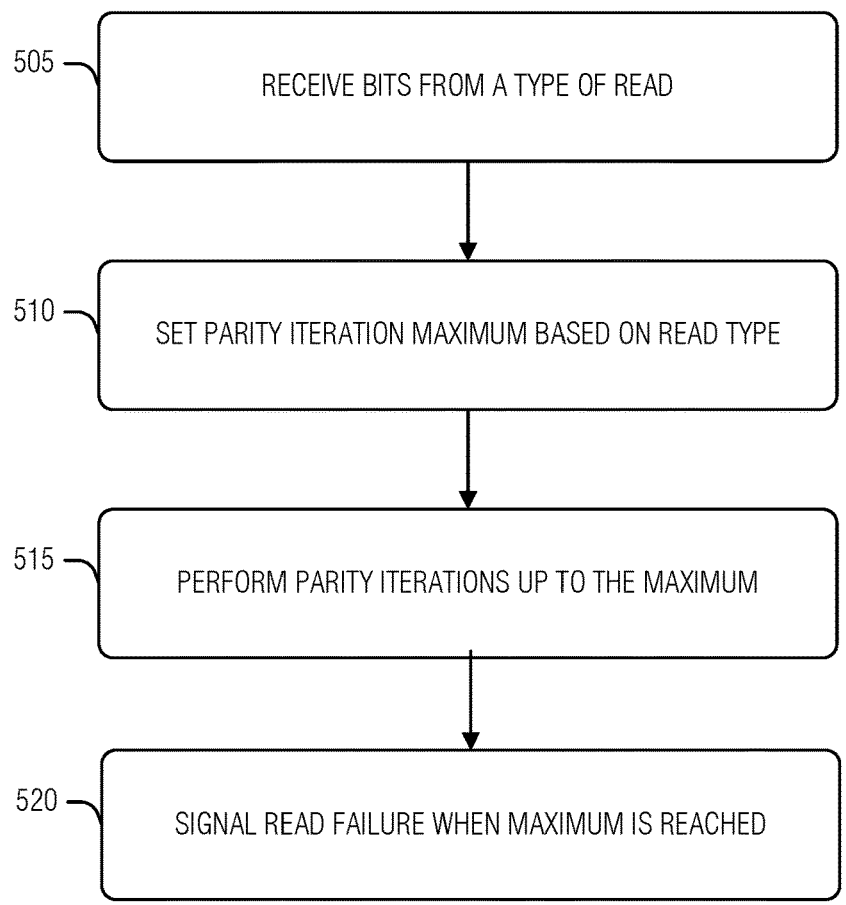
FIG. 5 illustrates a flowchart of a method for variable read ECC.

FIG. 5 illustrates a flowchart of a method 500 for variable read ECC. The operations of the method 500 are implemented in computer hardware, such as those described above (e.g., memory controller, array controller, etc.) or below (e.g., processing circuitry).

At operation 505, bits from a read are received. Here, the read has a corresponding type that is one of several types that can be assigned to reads. In an example, the type is a performance type. In an example, the type is an unflagged read.

At operation 510, a low-density parity-check (LDPC) iteration maximum is set based on the type. In an example, the LDPC iteration maximum implements a performance change in read throughput. In an example, the performance change occurs at between thirty-five error bits per one thousand bits and forty-five error bits per one thousand bits inclusive.

At operation 515, LDPC iterations are performed up to the LDPC iteration maximum.

At operation 520, a read failure is signaled in response to the LDPC iterations reaching the LDPC iteration maximum.

In an example, the method 500 can be extended to include receiving the bits from a second read—where the second read corresponds to a second type from the several types, setting a second LDPC iteration maximum based on the second type, performing second LDPC iterations up to the second LDPC iteration maximum, and signaling a read failure in response to the second LDPC iterations reaching the second LDPC iteration maximum. In an example, the second read is a result of a read error handling operation following the read failure in response to the LDPC iterations reaching the LDPC iteration maximum. In an example, the second type is a read-error type. In an example, the read-error type is signaled with a bit in a read interface.

In an example, the second LDPC iteration maximum is a multiple of the LDPC iteration maximum. In an example, the multiple is two or three times. In an example, signaling the read failure in response to the second LDPC iterations reaching the second LDPC iteration maximum provokes a read trial operation.

In an example, the method 500 can be extended to include receiving bits from a third read—the third read of the same type as the type of the first read (e.g., operation 505), setting the LDPC iteration maximum based on the type (e.g., the same LDPC iteration maximum of operation 510), performing fewer of the LDPC iterations than the LDPC iteration maximum, and signaling a read success in response to the LDPC iterations terminating prior to reaching the LDPC iteration maximum.

Figure 6:
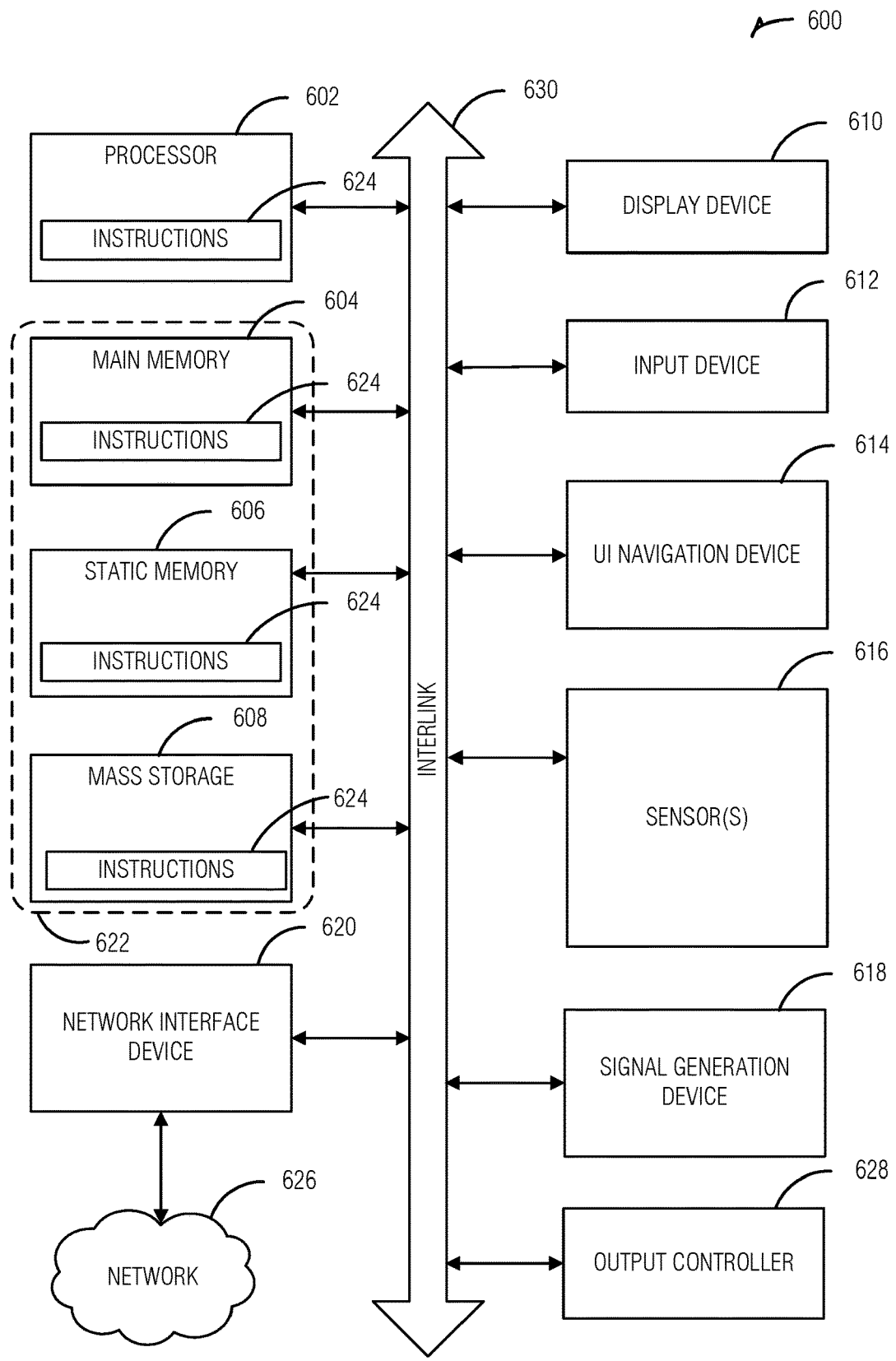
FIG. 6 is a block diagram illustrating an example of a machine upon which one or more embodiments can be implemented.

FIG. 6 illustrates a block diagram of an example machine 600 upon which any one or more of the techniques (e.g., methodologies) discussed herein can perform. In alternative embodiments, the machine 600 can operate as a standalone device or can be connected (e.g., networked) to other machines. In a networked deployment, the machine 600 can operate in the capacity of a server machine, a client machine, or both in server-client network environments. In an example, the machine 600 can act as a peer machine in peer-to-peer (P2P) (or other distributed) network environment. The machine 600 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 600 (e.g., the host device 105, the memory device 110, etc.) can include a hardware processor 602 (e.g., a central processing unit (CPU), a graphics processing unit (GPU), a hardware processor core, or any combination thereof, such as the memory controller 115, etc.), a main memory 604 and a static memory 606, some or all of which can communicate with each other via an interlink (e.g., bus) 608. The machine 600 can further include a display unit 610, an alphanumeric input device 612 (e.g., a keyboard), and a user interface (UI) navigation device 614 (e.g., a mouse). In an example, the display unit 610, input device 612 and UI navigation device 614 can be a touch screen display. The machine 600 can additionally include a storage device (e.g., drive unit) 608, a signal generation device 618 (e.g., a speaker), a network interface device 620, and one or more sensors 616, such as a global positioning system (GPS) sensor, compass, accelerometer, or other sensor. The machine 600 can include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 608 can include a machine readable medium 622 on which is stored one or more sets of data structures or instructions 624 (e.g., software) embodying or utilized by any one or more of the techniques or functions described herein. The instructions 624 can also reside, completely or at least partially, within the main memory 604, within static memory 606, or within the hardware processor 602 during execution thereof by the machine 600. In an example, one or any combination of the hardware processor 602, the main memory 604, the static memory 606, or the storage device 608 can constitute the machine readable medium 622.

While the machine readable medium 622 is illustrated as a single medium, the term "machine readable medium" can include a single medium or multiple media (e.g., a centralized or distributed database, or associated caches and servers) configured to store the one or more instructions 624.

The term "machine readable medium" can include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data are stored on the storage device 621, can be accessed by the memory 604 for use by the processor 602. The memory 604 (e.g., DRAM) is typically fast, but volatile, and thus a different type of storage than the storage device 621 (e.g., an SSD), which is suitable for long-term storage, including while in an "off" condition. The instructions 624 or data in use by a user or the machine 600 are typically loaded in the memory 604 for use by the processor 602. When the memory 604 is full, virtual space from the storage device 621 can be allocated to supplement the memory 604; however, because the storage 621 device is typically slower than the memory 604, and write speeds are typically at least twice as slow as read speeds, use of virtual memory can greatly reduce user experience due to storage device latency (in contrast to the memory 604, e.g., DRAM). Further, use of the storage device 621 for virtual memory can greatly reduce the usable lifespan of the storage device 621.

In contrast to virtual memory, virtual memory compression (e.g., the Linux® kernel feature "ZRAM") uses part of the memory as compressed block storage to avoid paging to the storage device 621. Paging takes place in the compressed block until it is necessary to write such data to the storage device 621. Virtual memory compression increases the usable size of memory 604, while reducing wear on the storage device 621.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 624 can further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks) such as those defined by the Third Generation Partnership Project (3GPP) families of standards (e.g., 3G, 4G, 5G, Long Term Evolution (LTE), etc.), Plain Old Telephone (POTS) networks, and wireless data networks (e.g., Institute of Electrical and Electronics Engineers (IEEE) 802.11 family of standards known as Wi-Fi®), IEEE 802.15.4 family of standards, peer-to-peer (P2P) networks, among others. In an example, the network interface device 620 can include one or more physical jacks (e.g., Ethernet, coaxial, or phone jacks) or one or more antennas to connect to the communications network 626. In an example, the network interface device 620 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that can store, encoding or carrying instructions for execution by the machine 600, and includes digital or analog communications signals or other intangible medium to facilitate communication of such software.

ADDITIONAL EXAMPLES

Example 1 is a controller for variable read error code correction (ECC), the controller comprising: an interface to receive bits from a read, the read of a type, the type being one of several types assigned to reads; and an ECC component to: set a low-density parity-check (LDPC) iteration maximum based on the type; perform LDPC iterations up to the LDPC iteration maximum; and signal a read failure in response to the LDPC iterations reaching the LDPC iteration maximum.

In Example 2, the subject matter of Example 1, wherein the LDPC iteration maximum implements a performance change in read throughput.

In Example 3, the subject matter of Example 2, wherein the performance change occurs at between thirty-five error bits per one thousand bits and forty-five error bits per one thousand bits inclusive.

In Example 4, the subject matter of any of Examples 1-3, wherein the interface is configured to receive the bits from a second read, the second read of a second type from the several types; and wherein the ECC component is configured to: set a second LDPC iteration maximum based on the second type; perform second LDPC iterations up to the second LDPC iteration maximum; and signal a read failure in response to the second LDPC iterations reaching the second LDPC iteration maximum.

In Example 5, the subject matter of Example 4, wherein the second type is a read-error type.

In Example 6, the subject matter of Example 5, wherein the read-error type is signaled with a bit in a read interface.

In Example 7, the subject matter of any of Examples 4-6, wherein the second LDPC iteration maximum is a multiple of the LDPC iteration maximum.

In Example 8, the subject matter of Example 7, wherein the multiple is two or three times.

In Example 9, the subject matter of any of Examples 4-8, wherein the second read is a result of a read error handling operation following the read failure in response to the LDPC iterations reaching the LDPC iteration maximum.

In Example 10, the subject matter of any of Examples 4-9, wherein, to signal the read failure in response to the second LDPC iterations reaching the second LDPC iteration maximum, the ECC component is configured to provoke a read trial operation.

In Example 11, the subject matter of any of Examples 1-10, wherein the type is a performance type.

In Example 12, the subject matter of Example 11, wherein the type is an unflagged read.

In Example 13, the subject matter of any of Examples 1-12, wherein the interface is configured to receive bits from a third read, the third read of the type; and wherein the ECC component is configured to: set the LDPC iteration maximum based on the type; perform fewer of the LDPC iterations than the LDPC iteration maximum; and signal a read success in response to the LDPC iterations terminating prior to reaching the LDPC iteration maximum.

Example 14 is a method for variable read error code correction (ECC), the method comprising: receiving bits from a read, the read of a type, the type being one of several types assigned to reads; setting a low-density parity-check (LDPC) iteration maximum based on the type; performing LDPC iterations up to the LDPC iteration maximum; and signaling a read failure in response to the LDPC iterations reaching the LDPC iteration maximum.

In Example 15, the subject matter of Example 14, wherein the LDPC iteration maximum implements a performance change in read throughput.

In Example 16, the subject matter of Example 15, wherein the performance change occurs at between thirty-five error bits per one thousand bits and forty-five error bits per one thousand bits inclusive.

In Example 17, the subject matter of any of Examples 14-16, comprising: receiving the bits from a second read, the second read of a second type from the several types; setting a second LDPC iteration maximum based on the second type; performing second LDPC iterations up to the second LDPC iteration maximum; and signaling a read failure in response to the second LDPC iterations reaching the second LDPC iteration maximum.

In Example 18, the subject matter of Example 17, wherein the second type is a read-error type.

In Example 19, the subject matter of Example 18, wherein the read-error type is signaled with a bit in a read interface.

In Example 20, the subject matter of any of Examples 17-19, wherein the second LDPC iteration maximum is a multiple of the LDPC iteration maximum.

In Example 21, the subject matter of Example 20, wherein the multiple is two or three times.

In Example 22, the subject matter of any of Examples 17-21, wherein the second read is a result of a read error handling operation following the read failure in response to the LDPC iterations reaching the LDPC iteration maximum.

In Example 23, the subject matter of any of Examples 17-22, wherein signaling the read failure in response to the second LDPC iterations reaching the second LDPC iteration maximum provokes a read trial operation.

In Example 24, the subject matter of any of Examples 14-23, wherein the type is a performance type.

In Example 25, the subject matter of Example 24, wherein the type is an unflagged read.

In Example 26, the subject matter of any of Examples 14-25, comprising: receiving bits from a third read, the third read of the type; setting the LDPC iteration maximum based on the type; performing fewer of the LDPC iterations than the LDPC iteration maximum; and signaling a read success in response to the LDPC iterations terminating prior to reaching the LDPC iteration maximum.

Example 27 is a machine readable medium including instructions for variable read error code correction (ECC), the instruction, when executed by processing circuitry, cause the processing circuitry to perform operations comprising: receiving bits from a read, the read of a type, the type being one of several types assigned to reads; setting a low-density parity-check (LDPC) iteration maximum based on the type; performing LDPC iterations up to the LDPC iteration maximum; and signaling a read failure in response to the LDPC iterations reaching the LDPC iteration maximum.

In Example 28, the subject matter of Example 27, wherein the LDPC iteration maximum implements a performance change in read throughput.

In Example 29, the subject matter of Example 28, wherein the performance change occurs at between thirty-five error bits per one thousand bits and forty-five error bits per one thousand bits inclusive.

In Example 30, the subject matter of any of Examples 27-29, wherein the operations comprise: receiving the bits from a second read, the second read of a second type from the several types; setting a second LDPC iteration maximum based on the second type; performing second LDPC iterations up to the second LDPC iteration maximum; and signaling a read failure in response to the second LDPC iterations reaching the second LDPC iteration maximum.

In Example 31, the subject matter of Example 30, wherein the second type is a read-error type.

In Example 32, the subject matter of Example 31, wherein the read-error type is signaled with a bit in a read interface.

In Example 33, the subject matter of any of Examples 30-32, wherein the second LDPC iteration maximum is a multiple of the LDPC iteration maximum.

In Example 34, the subject matter of Example 33, wherein the multiple is two or three times.

In Example 35, the subject matter of any of Examples 30-34, wherein the second read is a result of a read error handling operation following the read failure in response to the LDPC iterations reaching the LDPC iteration maximum.

In Example 36, the subject matter of any of Examples 30-35, wherein signaling the read failure in response to the second LDPC iterations reaching the second LDPC iteration maximum provokes a read trial operation.

In Example 37, the subject matter of any of Examples 27-36, wherein the type is a performance type.

In Example 38, the subject matter of Example 37, wherein the type is an unflagged read.

In Example 39, the subject matter of any of Examples 27-38, wherein the operations comprise: receiving bits from a third read, the third read of the type; setting the LDPC iteration maximum based on the type; performing fewer of the LDPC iterations than the LDPC iteration maximum; and signaling a read success in response to the LDPC iterations terminating prior to reaching the LDPC iteration maximum.

Example 40 is a system for variable read error code correction (ECC), the system comprising: means for receiving bits from a read, the read of a type, the type being one of several types assigned to reads; means for setting a low-density parity-check (LDPC) iteration maximum based on the type; means for performing LDPC iterations up to the LDPC iteration maximum; and means for signaling a read failure in response to the LDPC iterations reaching the LDPC iteration maximum.

In Example 41, the subject matter of Example 40, wherein the LDPC iteration maximum implements a performance change in read throughput.

In Example 42, the subject matter of Example 41, wherein the performance change occurs at between thirty-five error bits per one thousand bits and forty-five error bits per one thousand bits inclusive.

In Example 43, the subject matter of any of Examples 40-42, comprising: means for receiving the bits from a second read, the second read of a second type from the several types; means for setting a second LDPC iteration maximum based on the second type; means for performing second LDPC iterations up to the second LDPC iteration maximum; and means for signaling a read failure in response to the second LDPC iterations reaching the second LDPC iteration maximum.

In Example 44, the subject matter of Example 43, wherein the second type is a read-error type.

In Example 45, the subject matter of Example 44, wherein the read-error type is signaled with a bit in a read interface.

In Example 46, the subject matter of any of Examples 43-45, wherein the second LDPC iteration maximum is a multiple of the LDPC iteration maximum.

In Example 47, the subject matter of Example 46, wherein the multiple is two or three times.

In Example 48, the subject matter of any of Examples 43-47, wherein the second read is a result of a read error handling operation following the read failure in response to the LDPC iterations reaching the LDPC iteration maximum.

In Example 49, the subject matter of any of Examples 43-48, wherein signaling the read failure in response to the second LDPC iterations reaching the second LDPC iteration maximum provokes a read trial operation.

In Example 50, the subject matter of any of Examples 40-49, wherein the type is a performance type.

In Example 51, the subject matter of Example 50, wherein the type is an unflagged read.

In Example 52, the subject matter of any of Examples 40-51, comprising: means for receiving bits from a third read, the third read of the type; means for setting the LDPC iteration maximum based on the type; means for performing fewer of the LDPC iterations than the LDPC iteration maximum; and means for signaling a read success in response to the LDPC iterations terminating prior to reaching the LDPC iteration maximum.

Example 53 is at least one machine-readable medium including instructions that, when executed by processing circuitry, cause the processing circuitry to perform operations to implement of any of Examples 1-52.

Example 54 is an apparatus comprising means to implement of any of Examples 1-52.

Example 55 is a system to implement of any of Examples 1-52.

Example 56 is a method to implement of any of Examples 1-52.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device can be configured to provide wear cycle information to the memory device with each memory operation. The memory device control circuitry (e.g., control logic) can be programmed to compensate for memory device performance changes corresponding to the wear cycle information. The memory device can receive the wear cycle information and determine one or more operating parameters (e.g., a value, characteristic) in response to the wear cycle information.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMS), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A controller for variable read error code correction (ECC), the controller comprising:
   a hardware interface to receive bits from a read, the read of a type, the type being one of several types assigned to reads; and
   an ECC component to:
      set a low-density parity-check (LDPC) iteration maximum based on the type, wherein the LDPC iteration maximum is less than a total number of possible LDPC decodes;
      perform LDPC iterations, on the bits from the read, up to the LDPC iteration maximum; and
      signal a read failure, in response to the LDPC iterations reaching the LDPC iteration maximum, to:
         provoke other error correction options on the bits to recover data; or
         indicate that the data is lost.

2. The controller of claim 1, wherein the hardware interface is configured to receive the bits from a second read, the second read of a second type from the several types; and wherein the ECC component is configured to:

set a second LDPC iteration maximum based on the second type;
perform second LDPC iterations up to the second LDPC iteration maximum; and
signal a read failure in response to the second LDPC iterations reaching the second LDPC iteration maximum.

3. The controller of claim 2, wherein the second type is a read-error type.

4. The controller of claim 2, wherein the second LDPC iteration maximum is a multiple of the LDPC iteration maximum.

5. The controller of claim 2, wherein the second read is a result of a read error handling operation following the read failure in response to the LDPC iterations reaching the LDPC iteration maximum.

6. The controller of claim 2, wherein, to signal the read failure in response to the second LDPC iterations reaching the second LDPC iteration maximum, the ECC component is configured to provoke a read trial operation.

7. The controller of claim 1, wherein the type is a performance type.

8. The controller of claim 1, wherein the hardware interface is configured to receive bits from a third read, the third read of the type; and wherein the ECC component is configured to:
set the LDPC iteration maximum based on the type;
perform fewer of the LDPC iterations than the LDPC iteration maximum; and
signal a read success in response to the LDPC iterations terminating prior to reaching the LDPC iteration maximum.

9. A method for variable read error code correction (ECC), the method comprising:
receiving bits from a read, the read of a type, the type being one of several types assigned to reads;
setting a low-density parity-check (LDPC) iteration maximum based on the type, wherein the LDPC iteration maximum is less than a total number of possible LDPC decodes;
performing LDPC iterations, on the bits from the read, up to the LDPC iteration maximum; and
signaling a read failure a read failure, in response to the LDPC iterations reaching the LDPC iteration maximum, to:
provoke other error correction options on the bits to recover data; or
indicate that the data is lost.

10. The method of claim 9, comprising:
receiving the bits from a second read, the second read of a second type from the several types;
setting a second LDPC iteration maximum based on the second type;
performing second LDPC iterations up to the second LDPC iteration maximum; and
signaling a read failure in response to the second LDPC iterations reaching the second LDPC iteration maximum.

11. The method of claim 10, wherein the second type is a read-error type.

12. The method of claim 10, wherein the second LDPC iteration maximum is a multiple of the LDPC iteration maximum.

13. The method of claim 10, wherein the second read is a result of a read error handling operation following the read failure in response to the LDPC iterations reaching the LDPC iteration maximum.

14. The method of claim 10, wherein signaling the read failure in response to the second LDPC iterations reaching the second LDPC iteration maximum provokes a read trial operation.

15. The method of claim 9, wherein the type is a performance type.

16. The method of claim 9, comprising:
receiving bits from a third read, the third read of the type;
setting the LDPC iteration maximum based on the type;
performing fewer of the LDPC iterations than the LDPC iteration maximum; and
signaling a read success in response to the LDPC iterations terminating prior to reaching the LDPC iteration maximum.

17. A machine readable medium including instructions for variable read error code correction (ECC), the instruction, when executed by processing circuitry, cause the processing circuitry to perform operations comprising:
receiving bits from a read, the read of a type, the type being one of several types assigned to reads;
setting a low-density parity-check (LDPC) iteration maximum based on the type, wherein the LDPC iteration maximum is less than a total number of possible LDPC decodes;
performing LDPC iterations, on the bits from the read, up to the LDPC iteration maximum; and
signaling a read failure a read failure, in response to the LDPC iterations reaching the LDPC iteration maximum, to:
provoke other error correction options on the bits to recover data; or
indicate that the data is lost.

18. The machine readable medium of claim 17, wherein the operations comprise:
receiving the bits from a second read, the second read of a second type from the several types;
setting a second LDPC iteration maximum based on the second type;
performing second LDPC iterations up to the second LDPC iteration maximum; and
signaling a read failure in response to the second LDPC iterations reaching the second LDPC iteration maximum.

19. The machine readable medium of claim 18, wherein the second type is a read-error type.

20. The machine readable medium of claim 18, wherein the second LDPC iteration maximum is a multiple of the LDPC iteration maximum.

21. The machine readable medium of claim 18, wherein the second read is a result of a read error handling operation following the read failure in response to the LDPC iterations reaching the LDPC iteration maximum.

22. The machine readable medium of claim 18, wherein signaling the read failure in response to the second LDPC iterations reaching the second LDPC iteration maximum provokes a read trial operation.

23. The machine readable medium of claim 17, wherein the type is a performance type.

24. The machine readable medium of claim 17, wherein the operations comprise:
receiving bits from a third read, the third read of the type;
setting the LDPC iteration maximum based on the type;
performing fewer of the LDPC iterations than the LDPC iteration maximum; and signaling a read success in response to the LDPC iterations terminating prior to reaching the LDPC iteration maximum.

\* \* \* \* \*